United States Patent [19]

Dapkus et al.

[11] 3,900,864

[45] Aug. 19, 1975

[54] MONOLITHIC LED DISPLAYS

[75] Inventors: Paul Daniel Dapkus, Bernardsville; Richard Wayne Dixon, Morristown; Walter Werner Weick, Somerville, all of N.J.

[73] Assignee: Bell Telephone Laboratories, Incorporated, Murray Hill, N.J.

[22] Filed: Oct. 9, 1973

[21] Appl. No.: 404,599

Related U.S. Application Data

[63] Continuation-in-part of Ser. No. 361,252, May 17, 1973.

[52] U.S. Cl. ...................... 357/18; 357/17; 357/55; 357/61

[51] Int. Cl. .......................................... H05b 33/00

[58] Field of Search ... 317/235 N, 235 AJ, 235 AK; 313/108 D; 357/17, 18, 19, 30, 55, 61

[56] References Cited

UNITED STATES PATENTS

| | | | |
|---|---|---|---|
| 3,457,633 | 7/1969 | Marinace | 29/583 |
| 3,525,024 | 8/1970 | Kawaji | 317/234 |
| 3,551,763 | 12/1970 | Hakki | 317/237 |

*Primary Examiner*—Martin H. Edlow
*Attorney, Agent, or Firm*—P. V. D. Wilde

[57] ABSTRACT

The specification describes a process for defining the active-display regions in a monolithic electroluminescent display device. According to the process, the emitting regions of a semiconductor chip are electrically and optically isolated from the rest of the chip by laser machining. The chip remains intact with grooves extending below the junction to form active junction "islands." The technique is advantageous with indirect band gap semiconductors, such as GaP, that can be viewed through the unmachined surface. In a preferred form the grooves are formed in a grid configuration. This structure has advantages in terms of cost and simplicity of manufacture.

7 Claims, 11 Drawing Figures

MONOLITHIC LED DISPLAYS

CROSS REFERENCE TO RELATED APPLICATION

This application is a continuation-in-part of copending application, Ser. No. 361,252, filed May 17, 1973.

BACKGROUND OF THE INVENTION

Due to the high cost of semiconductor material for electroluminescent devices, some of those engaged in the design of light-emitting displays have developed a hybrid approach to display fabrication in which only the active or light-emitting regions of the display are provided with semiconductor material. Since visible displays are large by integrated circuit standards, a monolithic approach that leaves unused semiconductor material over the inactive regions between and within the characters has been regarded as extravagent.

With recent developments, display applications have emerged in which the monolithic approach is favored over the hybrid display from both a performance and an economic standpoint. The favorable economic outlook is based partly on projections of declining material costs, in view of past experience with semiconductor materials, and on savings in processing. Reasons for anticipating processing economies are similar to those that favor costwise integrated circuits over hybrid circuits. A major advantage is the elimination of the need for handling each bar or dot of the display and individually bonding these to a support body.

The monolithic approach using indirect band gap semiconductors, such as GaP, poses special considerations. Since the electroluminescent radiation produced in these materials is not absorbed by the semiconductor, the light emitted at selected portions of the display, e.g., the bars in a bar display, tends to spread and the lines forming the characters "wash" out. On the other hand, this relative transparency permits packaging schemes which are very attractive and which are not available in a material (such as GaAsP) that strongly absorbs the emitted radiation.

Monolithic electroluminescent displays have been proposed in several forms. These typically involve the formation of electroluminescent junctions selectively in those regions of the chip that are to emit light. In a typical bar display, these would be seven bar-shaped junctions arranged in a box figure 8. Individual contacts are provided to each bar.

Diffusing impurities through an appropriate mask to form the selected area p-n junctions is straightforward, except that the quality of diffused junctions formed in certain electroluminescent materials is inadequate. In GaP, junctions formed by liquid regrowth, i.e., liquid phase epitaxy (LPE), are preferred. Therefore, it has been proposed to form selected area junctions in GaP by mesa techniques, e.g., forming a continuous LPE layer over the monolithic chip, masking the active light-emitting areas, and etching away the surrounding portions of the junctions. However, the mesa technique yields a nonplanar structure, and mesa etching places stringent requirements on layer thickness uniformity, requires multiple photolithography steps, and has limited resolution for small numeric fabrication.

Selected area junctions have also been formed in GaP by etching grooves into those regions of the surface that are to emit light, and growing selectively in the grooves to form p-n junctions. These structures are essentially planar. But structures made this way from indirect band gap materials have low optical coupling efficiency for the reason described previously.

A technique has been developed in which the active light-emitting regions of a monolithic electroluminescent display are defined in a way that produces a planar structure while effectively isolating the emitting regions both electrically and optically from the remainder of the semiconductor chip. The technique begins with a planar semiconductor chip, having at least one large area light-emitting p-n junction formed into a surface. The junction may be fomed by an appropriate technique such as duffusion or liquid phase epitaxy (LPE). The invention is most likely to be applied to materials, such as GaP, in which efficient light-emitting junctions are formed by LPE because in materials that are susceptible to diffusion processing, character delineation can be made by known masking techniques. On the other hand, certain advantages may accrue from the technique of the invention even in those materials. For example, the technique of the invention eliminates the need for a selective masking step and may result in more effective or inexpensive character definition.

According to the invention, the active light-emitting regions are defined by machining a narrow "moat" around each active element of the display. The moats are formed by directing a laser beam at the surface of the semiconductor and evaporating the semiconductor to a depth exceeding the junction depth.

Each element of the array thus formed is an electrical island to which electrical contact can be made by any of several ways. The moat also provides optical isolation, first, by terminating the boundary of the light-emitting junction in a well-defined way, and, second, by interposing between the active and passive portions of the chip two interfaces that tend to reflect light spreading laterally back toward the direction desired.

in a preferred embodiment, the display comprises an indirect band gap semiconductor such as GaP. Owing to the transparency of this kind of material, there are two ways in which one can view the display structure; from the epitaxial side or through the substrate. The latter is not possible with direct gap material such as GaAsP. It is advantageous to view the laser-defined GaP numerics through the substrate for two reasons. First, viewing the numeric through the unbroken, optically flat substrate removes many distracting imperfections, metalizations, etc., from the view of the observer. The optical effect is therefore pleasing and contrast is enhanced. Secondly, this direction of viewing is compatible with the possibility of achieving single-step bonding to all of the numeric contacts and this in turn can be a key to achieving low cost, large quantity manufacturability.

These and other aspects of the invention will become more apparent from the following detailed description.

DETAILED DESCRIPTION

Figure 1:
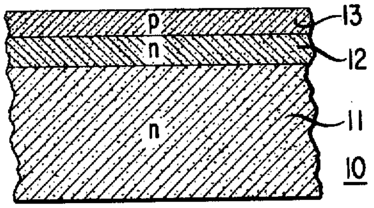
FIG. 1 is a front-sectional view of a typical electroluminescent semiconductor chip prior to processing.

FIG. 1 shows a portion of a chip to be processed in accordance with the invention. The chip 10 consists of a substrate portion 11 that, in this embodiment, is n-type GaP prepared by the known liquid encapsulated Czochralski technique. The substrate crystal has a typical thickness of 8–10 mils. The layer 12 is an n-type layer produced, for example, by liquid phase epitaxy and the top layer 13 is a nitrogen doped p-type layer grown by the same technique and forming with the n-layer a green-emitting p-n junction. These layers are typically of the order of one mil thick. They can be formed with complementary conductivity types if desired. The chip 10, ¼ inch × ¼ inch, was derived from a larger, polished wafer by laser separation. Alternatively, the wafer can be divided into individual chips after machining.

Figure 2:
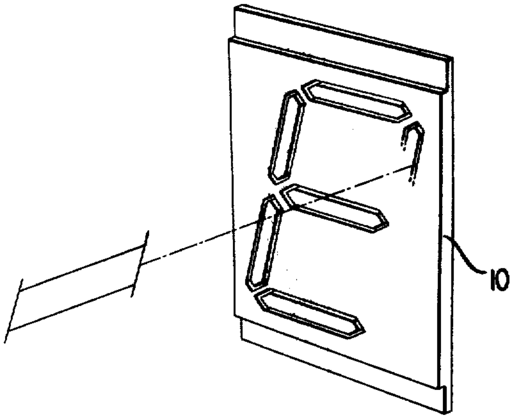
FIG. 2 is a perspective view of the chip during laser machining with the machining apparatus shown schematically.
Figure 3:
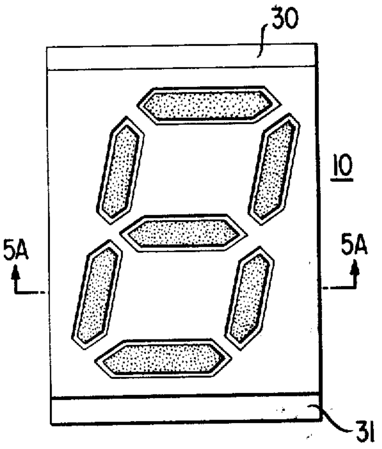
FIG. 3 is a plan view of the chip after laser machining, showing the definition of the elements in a typical seven-bar character display.

The chip 10 is machined with a laser, as shown schematically in FIG. 2, to form the configuration of FIG. 3.

The basic principles of laser machining are known to those skilled in the art. Machining of gallium phosphide is not an obvious extension of former work because of the high optical transparency of this material. The effectiveness of the machining that was demonstrated in this work was therefore surprising.

Initial work was done on equipment described below relying on a numerically controlled, stepping motor driven, X-Y table for pattern definition.

A Quantronix ND:YAG laser Model 112 pumped with two tungsten-iodine lamps was employed in a Q-switched mode to machine the chip. The samples were positioned under a 20X, 0.25 NA Vickers lens with an 8 mm focal length by a numerically controlled X-Y table moving at 100 mils per second. The laser $TEM_{00}$ average power was 0.20 watts and the Q-switched pulses were 0.25 microseconds long at a rate of 1.5 kHz. Although these parameters were typical for the apparatus conveniently available for this work, other laser machining apparatus can operate at higher average power and higher pulse repetition rate by at least a factor of 20, and cutting rates of 5 inches per second can easily be achieved. At these speeds it becomes necessary to avoid inertial effects as the tracing changes direction. This can be accomplished, for example, by machining the same feature along a row of numerics with a gated laser. Other possibilities include laser beam deflection by means of galvanometer mirrors or acoustooptic deflectors, etc. With mechanical positioning a numeric pattern can be generated in 0.5 seconds.

The threshold peak power necessary to machine the GaP was 80 watts. A single pass with 200 watt peak power per pulse was used to machine a moat 0.7 mils wide and just over 1 mil deep.

Figure 4A:
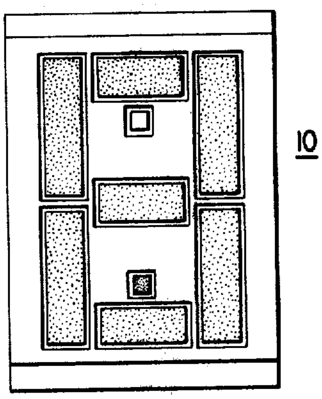
FIG. 4A to 4C are schematic representations of three different laser-machined numeric patterns described in connection with certain manufacturing considerations.

The first display with numeric, decimal point, and colon capability produced in quantity by this system is shown schematically in FIG. 4A. The light emitting areas are defined by machining a groove around each of the light emitting areas one by one. Because the system had no position feedback to control the gating of the laser, this was the most convenient way to produce a pattern such as that shown in the figure. It was apparent that such a system was not the most attractive for commercial production for reasons related both to speed limitations for this mode of cutting as well as nonuniform cutting due to stepping motor driving vibrations.

Figure 4B:
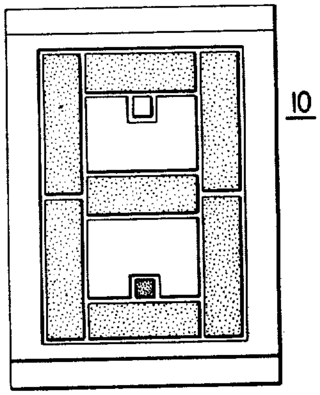

Commercial scribing apparatus is available which has DC motor driven X-Y tables. One such apparatus (Quantronix Corp. Model 603) has an X-Y table which, in addition to being DC motor driven, is computer controlled. As a result the position of the X-Y table is accurately known to 0.0001 inch at any instant and the laser can be gated at any point to produce with appropriate programming essentially any pattern. A cost effective pattern with centered decimal points is shown schematically in FIG. 4B. Note the reduction in the number of cuts over FIG. 4A. This pattern has been cut at a speed of 2 inches/sec. Though this display pattern is highly desirable from the point of view of display design, a major liability is that it requires a costly computer controlled system.

Figure 4C:
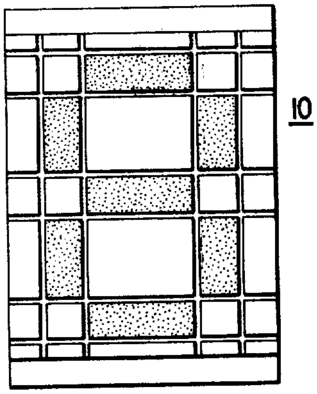

A display pattern which substantially reduces the number of cuts (by doing away with the centered decimal point) and at the same time can be produced by a non-computer-controlled and commercially available apparatus is shown in FIG. 4C. This pattern is produced by making continuous cuts across the wafer at appropriate places and allowing the intersection of these cuts to define the light emitting areas. This allows the use of inexpensive non-gated laser scribers to fabricate the chips. One such unit is, Quantronix Model 900 mini scriber. This type of display has been fabricated and found to be suitably attractive for most applications. The narrow kerf of the laser cut as compared to mechanical cutting minimizes the "shortening" of the vertical bars that results from this pattern definition technique and makes the technique feasible.

An unexpected feature of these demonstrations deserves comment. It was found that the laser could uniformly machine through the p-n junction even though the LPE layer thickness varied by as much as $30 \pm 15\mu$ across the slice. This was possible because a deep narrow groove could be formed without inordinately damaging the adjacent GaP. This lack of critical adjustment is considered an advantage from the standpoint of obtaining high yields.

Forming the moat by selective chemical etching was considered, but this would not produce the same kind of definition, control, and high yield. For example, it is not possible to obtain high (e.g., >1) depth-to-width aspect ratios as can be obtained with laser machining. Moreover, it would require masking, not simply with a photoresist, but, e.g., with an oxide masking layer, to allow etching to the required depth.

The laser machining step produces an opaque, locally damaged region of nonstoichiometric material in the moat region. To remove this, the n-surfaces, with the exception of a portion of the n-contact, were masked to protect their optical finish and the chips were immersed in a 60°C, 3:1:1 solution of $H_2SO_4$:$H_2O_2$:$H_2O$.

The solution was ultrasonically agitated to facilitate uniform etching in the grooves. The chips were typically etched for 10 minutes in this way to insure that the junction damage was removed. Excellent I-V characteristics were obtained on devices processed in this way. Because 3:1:1 is a preferential etch for p-type GaP when contacts are present, (J. Electrochemistry, Sec. 119, p. 1233, 1972) some difficulty was experienced using this etch. This was particularly true for the samples with a bar contact pattern where etching of the top surface of the p-layer and undercutting of the contact was a problem. Furthermore, complete removal of the resolidified material on the n-side of the groove did not occur. In spite of these difficulties, the optical and electrical properties of the mesas obtained using this simple etching procedure are very satisfactory. The grooves on another slice which was covered with $SiO_2$ prior to laser machining were satisfactorily cleaned using aqua regia. No doubt other etching schemes are quite practical and can be developed. However, the 3:1:1 etch was adequate since the resulting electrical and optical device properties were good and the contact undercutting was easily tolerable.

The machined areas shown at 30 and 31 of FIG. 3 expose the underlying n-layer 12 to accommodate electrical contacts.

Figure 5A:
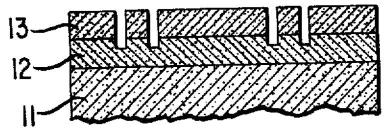
FIG. 5A is a sectional view through 5A—5A of FIG. 3.

The chip, after machining to define the active junction regions, is shown in cross section in FIG. 5A. The view is a section through 5A—5A of FIG. 3. Note that it is only essential that the moat extend to a depth just beyond the junction. It can be appreciated intuitively that these moats will discourage light that emits from the junction from channeling laterally along the display, and will therefore provide useful optical isolation between active elements. Greater isolation can be achieved by making the moats deeper. This requires either more laser power or increased processing time. For example, with the laser described before, operating with a peak power of 380 watts per pulse, a 5 mil moat, 0.7 mils wide, can be formed with three passes. Moats this deep introduce the risk of fracture of the chip, but can be useful if the processing is done with care. This also demonstrates that chips with deep-lying junctions can be processed accordingly to the invention.

Figure 5B:
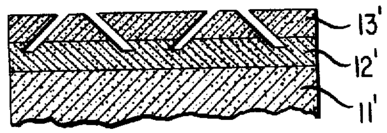
FIG. 5B is a view similar to that of FIG. 4A, showing a modified machined area.

Enhanced brightness of the mesa can be achieved by machining at an angle with respect to the top surface of the meterial to produce an angle-walled mesa. These structures reflect laterally-directed light toward the viewer. An angle-walled structure in which the angles are approximately 45° to the surface is depicted in FIG. 5B. The prime numbers correspond to equivalent structural features in FIG. 5A. With the angle shown here, 45°, the reflected light is directed directly toward the viewer and is incident on the exit interface of the crystal (here, the surface toward the viewer) at approximately 90°. If the angle of the moat departs significantly from 45°, then the reflected light will be internally reflected at the surface. Therefore, it is preferred that the angle of the moat be $45° \pm 15°$.

Figure 6:
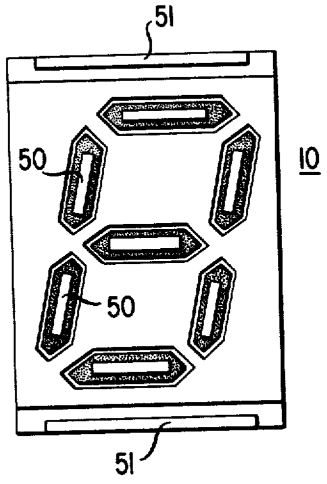
FIG. 6 is a view similar to FIG. 3, showing one approach to contacting the isolated elements.
Figure 7:
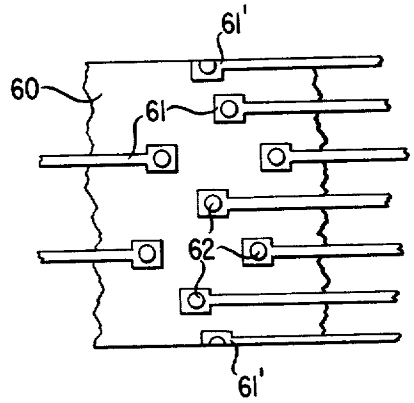
FIG. 7 is a plan view of a portion of a substrate to which the chip of FIG. 5 can be bonded.
Figure 8:
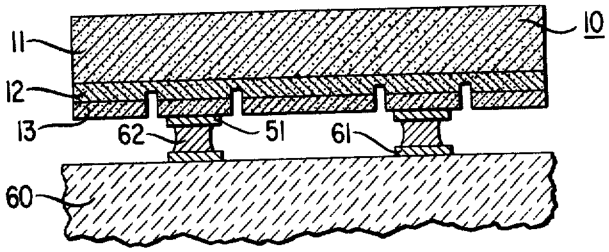
FIG. 8 is a sectional view, showing the chip of FIG. 5 bonded to the substrate of FIG. 6.

The active elements can be contacted in a number of ways. One of these is illustrated in FIGS. 6–8. A standard metallized gold electrode pattern is formed on the chip 10 as shown in FIG. 6. The individual contacts 50 can cover any portion of the p-type material and the n-type contacts 51 cover at least portions of the regions of the n-layer exposed by machining as described in connection with FIG. 3. Alternatively, a conductive layer can be applied to the surface of the p-layer prior to maching and the contact regions will be defined during machining along with the active semiconductor regions. A similar approach can be followed in which a thin "strike" later of metallization is applied before machining and thicker contact layers applied after machining, by known techniques of electroless deposition using the strike layers to catalyze the electroless deposit.

It will be appreciated that with the technique suggested by FIG. 6 the tolerances for the metallization are large enough that the mask registration needed to form the contacts is not critical. It will also be appreciated that the details of the metallization procedures just mentioned are well established in the art. The particular embodiment shown was made by evaporating Au-Si and patterning using metal masks.

A substrate appropriate for supporting the chip shown in FIG. 6 is shown in FIG. 7. The base 60 is a standard alumina substrate and the contacts and circuit paths 61 are Be-Au formed by standard printed circuit techniques similar to that indicated above. The contact pads are formed in a pattern complementary to the pattern of the contacts 51 on the GaP chip. Conductive epoxy dots 62 are applied to each pad and the chip 10 is bonded to the substrate 60, as shown in cross section in FIG. 8. The contact pads 61' are for contacting the metallized regions 51 on the n-layer 12 and are advantageously raised, made thicker, or other provision made to accommodate the step occurring as the result of the removal of that part of layer 12.

Using a similar approach, the chip can be soldered or thermocompression bonded to the substrate.

While the foregoing description involved a single character on the semiconductor chip, the enitire array, involving as many characters as desired or in any configuration of active elements (any character shape), can be produced in a similar fashion.

The fundamental questions to be answered, once the ability to machine patterns has been shown, concern the electrical and opticat properties of the junction regions defined in this way. In particular, does laser machining through the epitaxial layers cause bulk damage which cannot be removed by etching? Evidence is provided by the following study which compared individual diced chips fabricated in three different ways. Table I shows an efficiency comparison between adjacent rows of devices which had been separated by (1) laser scribing the LED substrate and breaking through the junction, (2) laser scribing through the junction and breaking through the substrate and (3) slurry cutting through the entire thickness.

TABLE I

Efficiency Comparison for Laser Scribed LED's and Slurry Cut LED's

| | Laser Scribed and Broken* | | Diced |
|---|---|---|---|
| | P side | N side | |
| Row A | .073 | .068 | .071 |
| Row B | .065 | .063 | .063 |
| Row C | .058 | .059' | .066 |
| Row D | .041 | .042 | .039 |

*Represents average of 4 device efficiencies at ~7A/cm² to average area fluctuations.
Efficiencies are for unencapsulated devices.

As can be seen, there is no essential difference among the efficiencies of the devices after etching. This comparison shows no evidence of bulk damage resulting from laser machining through the junction. As indicated before, the surface damage which is produced can be easily removed by etching.

The optical properties are best evaluated by subjective viewings of the character display. These were considered to be favorable. Contrast ratios of 100:1 were obtained with a numeric produced according to the foregoing procedures.

Various additional modifications and extensions of this invention will become apparent to those skilled in the art. All such variations and deviations which basically rely on the teachings through which this invention has advanced the art are properly considered to be within the spirit and scope of this invention.

What is claimed is:

1. A light-emitting diode display device comprising a planar indirect band gap semiconductor chip, a large area, essentially planar, p-n junction formed within a major portion of the surface of the chip, a multiplicity of grooves formed into said major portion of the surface of the chip with a depth below the p-n junction and greater than the width of the grooves, each of said grooves defining an island on the chip and the islands defining the active light-emitting regions of the display, the said grooves providing a means for more effectively isolating the light-emitting regions, and electrical contacts to the islands and to the layer of the p-n junction remote from the surface.

2. The device of claim 1 in which the semiconductor is gallium phosphide.

3. The device of claim 1 in which the grooves extend into the semiconductor surface at an angle with respect to the surface.

4. The device of claim 1 in which the semiconductor chip is bonded to a support substrate with the grooved side of the chip in contact with the substrate.

5. The device of claim 4 in which the electrical contacts are metallized regions that correspond to metallized regions on the substrate.

6. A light-emitting diode display comprising a plurality of semiconductor chips as defined in claim 1.

7. A light-emitting diode display device comprising a planar indirect band gap semiconductor chip, a large area, essentially planar, p-n junction formed within a major portion of the surface of the chip, a multiplicity of grooves formed into said major portion of the surface of the chip with a depth below the p-n junction and greater than the width of the grooves, the grooves comprising a first series of parallel grooves extending in one dimension along the surface and a second series of parallel grooves extending approximately orthogonal with respect to those of the first series thereby forming a multiplicity of islands of semiconductor regions, the said grooves providing a means for more effectively isolating the light-emitting regions, and electrical contacts to selected ones of those islands and to the layer of the p-n junction remote from the surface so as to form a desired pattern of active light-emitting regions.

* * * * *